(12) United States Patent
Kub et al.

(10) Patent No.: US 6,593,212 B1
(45) Date of Patent: Jul. 15, 2003

(54) METHOD FOR MAKING ELECTRO-OPTICAL DEVICES USING A HYDROGENION SPLITTING TECHNIQUE

(75) Inventors: Francis J. Kub, Arnold, MD (US); Karl D. Hobart, Upper Marlboro, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/985,958

(22) Filed: Oct. 29, 2001

(51) Int. Cl.$^7$ .......................... H01L 21/30; H01L 21/46
(52) U.S. Cl. ..................... 438/458; 438/22; 438/29; 438/31
(58) Field of Search ..................... 438/458, 22, 29, 438/31

(56) References Cited

U.S. PATENT DOCUMENTS

| | | |
|---|---|---|
| 5,374,564 A | 12/1994 | Bruel |
| 5,391,257 A | 2/1995 | Sullivan et al. |
| 5,401,544 A | 3/1995 | Nakahata et al. |
| 5,446,330 A | 8/1995 | Eda et al. |
| 5,448,126 A | 9/1995 | Eda et al. |
| 5,486,491 A * | 1/1996 | Sengupta et al. ........... 501/137 |
| 5,630,949 A | 5/1997 | Lakin |
| 5,714,395 A | 2/1998 | Bruel |
| 5,877,070 A | 3/1999 | Goesele et al. |
| 5,882,987 A | 3/1999 | Srikrishnan |
| 5,966,620 A | 10/1999 | Sakaguchi et al. |
| 5,991,326 A * | 11/1999 | Yeun et al. ..................... 327/96 |
| 5,993,677 A | 11/1999 | Biasse et al. |
| 5,994,207 A | 11/1999 | Henley et al. |
| 6,010,579 A | 1/2000 | Henley et al. |
| 6,020,252 A | 2/2000 | Aspar et al. |
| 6,054,370 A | 4/2000 | Doyle |
| 6,103,597 A | 8/2000 | Aspar et al. |
| 6,121,647 A * | 9/2000 | Yano et al. .................. 257/295 |
| 6,143,583 A * | 11/2000 | Hays ........................... 438/39 |
| 6,191,007 B1 * | 2/2001 | Matsui et al. ............... 438/459 |
| 6,242,324 B1 * | 6/2001 | Kub et al. ................... 438/455 |
| 6,303,468 B1 * | 10/2001 | Aspar et al. ................ 438/455 |
| 6,323,108 B1 * | 11/2001 | Kub et al. ................... 438/458 |
| 6,324,413 B1 * | 11/2001 | Simon et al. ............... 505/190 |
| 6,328,796 B1 | 12/2001 | Kub et al. |
| 6,344,404 B1 * | 2/2002 | Cheung et al. ............. 438/513 |
| 6,391,799 B1 * | 5/2002 | Di Cioccio ................. 438/781 |
| 2001/0014516 A1 * | 8/2001 | Shimoji ...................... 438/458 |

OTHER PUBLICATIONS

M. Bruel, "Silicon on Insulator Material Technology", Electronics Letters, Jul. 1995, pp. 1201–1202, vol. 31 No. 14.
K.D. Hobart, "Fabrication of SOI Substrates with Ultra–Thin Si Layers", Electronics Letters, Jun. 1998, vol. 34 No. 12.

(List continued on next page.)

*Primary Examiner*—Richard Elms
*Assistant Examiner*—Michael K. Luhrs
(74) *Attorney, Agent, or Firm*—John J. Karasek; George A. Kap

(57) ABSTRACT

A method is provided for transferring an electro-optical layer grown on a growth substrate to a handle substrate. The method includes implanting hydrogen ions in the transfer substrate to form an intermediate hydrogen ion implant layer and bonding the transfer substrate to the handle substrate to form a joined structure. The joined structure is heated to a temperature sufficient to split the joined structure to thereby transfer a portion of the electro-optical layer to the handle substrate.

26 Claims, 11 Drawing Sheets

OTHER PUBLICATIONS

K.D. Hobart, "Transfer of GaSb Thin Film To Insulting Substrate Via Separation by Hydrogen Implantation", Electronics Letters, Apr. 1999, vol. 35 No. 8.

F.J. Kub, "Single–Crystal Ferroelectric Microwave Capacitor Fabricated by Separation by Hydrogen Implantation", Electronics Letters, Mar. 1999, vol. 35 No. 6.

Q.Y. Tong, "Layer Splitting Process In Hydrogen–Implanted Si, Ge, SiC, and Diamond Substrates", American Institute of Physics, 1997.

B. Aspar, "The Generic Nature of the Smart–Cut Process for Thin Film Transfer", Electronic Materials, 2001 vol. 30 No. 7.

Kub et al, "Method For Making Shallow Diffusion Junctions In Semiconductor Using Elemental Doping", U.S. patent application 09/964545 Filed Sep. 28, 2001.

Kub et al, "Method Of Manufacturing A Semiconductor Device Having A Thin GaN Material Directly Bonded To An Optimized Substrate", U.S. patent application 09/964,546 Filed Sep. 28, 2001.

Kub et al, "Method For Trasnferring Thin Film Layer Material To A Flexible Substrate Using *A Hydrogen Ion Splitting Technique*", U.S. patent application 10/022,364 Filed Dec. 20, 2001.

Kub et al, "Method Of Making Mosaic Array of Thin Semiconductor Material Of Large Substrates", U.S. patent application 10/046,534 Filed Jan. 16, 2002.

Kub et al, "Method For Making Pyroelectric, Electro–Optical and Decoupling Capacitors Using Thin Film Transfer and Hydrogen Ion Splitting Techniques", U.S. patent application Filed Mar. 18, 2002.

Kub et al, "Method of Transferring Thin Film Funcitonal Material To Semiconductor Substrate or Optimized Substrate Using A Hydrogen Ion Splitting Technique", U.S. patent application, Filed Mar. 29, 2002.

Kub et al, "Method for Making Piezoelectric Resonator and Surface Acoustic Wave Device Using Hydrogen Implant Layer Splitting", U.S. patent application, Filed Apr. 22, 2002.

* cited by examiner

METHOD FOR MAKING ELECTRO-OPTICAL DEVICES USING A HYDROGENION SPLITTING TECHNIQUE

STATEMENT REGARDING FEDERALLY SPONSORED RESEARCH

This invention was made by employees of the United States Government and may be manufactured and used by or for the Government for governmental purposes without the payment of any royalties.

BACKGROUND OF THE INVENTION

1. Field of the Invention

The present invention relates to the manufacture of electro-optical devices, and in particular, to a method for manufacturing layered optical devices by transferring a thin electro-optical material layer from a transfer substrate optimized for electro-optical material layer formation, to a handle substrate such as a circuit-containing substrate, an insulting substrate, or optically transparent substrate.

2. Background of the Invention

Electro-optical devices include electro-optical waveguides, electro-optical modulators, optical switches, optical amplifiers, semiconductor optical amplifiers, waveguide lasers, waveguide optical amplifiers, waveguide second harmonic generators, surface normal spatial light modulators, optical parametric oscillators, and high frequency Bragg cells. These electro-optical devices include an electro-optical layer composed of an electro-optical material such as a photorefractive material and a ferroelectric crystal material. Examples of these electro-optical materials include $LiNbO_3$, $BaTiO_3$, $TeO_2$, $LiTaO_3$, $KNbO_3$, $BaSrNbO_3$, GaAs, InGaAsP, GaAs/AlGaAs multiquantum wells, InAsP/InGaP multiple quantum wells, InGaAlAs/InAlAs multiple quantum wells, and PLZT. All of these materials provide advantageous materials for electro optical components such are optical waveguides, electro-optical modulators, and optical switches due to their high electro-optical and photorefractive properties.

Rare-earth doped $LiNbO_3$ and $BaTiO_3$ are advantageous materials for optical amplifiers and waveguide lasers. Thin layers of PLZT are advantageous for use in spatial light modulators when the layers are illuminated perpendicular to the PLZT surface. Other materials include $KNbO_3$ which is advantageous for second harmonic generation (SHG) due to its large non-linear optical effect. $AgGaSe_2$ is advantageous for use in optical parametric oscillators (OPO).

In conventional electro-optical devices, the electro-optical layer is manufactured by growing a thin film layer of the electro-optical material on a substrate or the electro-optical layer is formed in a bulk substrate that has electro-optical properties. To obtain a high quality thin film electro-optical layer, the layer is typically grown on the substrate at a growth or annealing temperature of 500° C. to 1000° C. and is often grown on a single-crystal substrate in order to obtain a highly oriented or single crystal thin film electro-optical layer. The high growth temperature can prevent the utilization of electro-optical layers overtop of or on certain substrates. For example, it would be desirable to grow electro-optical material and a substrate that contains CMOS integrated circuits. Typically, such a circuit can withstand temperatures up to 400° C. to 500° C. This is especially relevant when the CMOS integrated circuit includes metal interconnections between circuitry layers. In addition, it is desirable to be able to grow the electro-optical material directly overtop of CMOS circuitry and use the CMOS circuitry to control the electro-optical component. The material layers that reside overtop of the CMOS circuitry are typically amorphous silicon oxide or silicon nitride layers and thus is not suitable as a substrate for the growth of highly oriented thin film electro-material layer. Therefore, it is generally not possible to obtain the best quality thin film electro-optical layer by growing the electro-optical layer directly on a CMOS substrate.

It is often desirable that the electro-optical components be fabricated using electro-optic material that is single-crystal to achieve the highest performance. Single crystal electro-optic material is typically obtained by growing crystals in bulk form or growing epitaxial layers on a bulk crystal.

A disadvantage with current electro-optical devices is that the electro-optical layer is formed on a substrate under conditions, which may not be optimal for electro-optical layer growth. Consequently, the quality of electro-optical layer may be limited due to its non-optimal growth condition.

Alternatively, an electro-optical layer may be grown on a substrate not optimal for an electro-optical device function. For example, a conventional optical modulators utilize coplanar electrode structure on the surface of the electro-optical material have a relatively high driving voltage to produce the necessary electric fields to modulate the electro-optic material. It would be desirable to have the metal electrodes defined above and below the electro-optical material with small distance separation to the electro-optic material to achieve high electric fields and thus requiring low driving voltages that allow higher modulation frequencies during the operation of the optical modulator and optical switches. In addition, to achieve high operating frequencies, it is desirable to arrange the metal electrodes in a transmission line arrangement on an insulating substrate with optimal dielectric constant such as quartz, semi-insulating GaAs, glass, polymer, sapphire or other suitable materials to be able to implant high frequency, low loss transmission lines.

As a result, the electro-optical device formed may be limited due to the non-optimal growth substrate characteristics.

BRIEF SUMMARY OF THE INVENTION

In accordance with the present invention, an electro-optical device manufacturing method is provided in which an electro-optical layer is transferred from a growth substrate to a handle substrate. The method includes using wafer bonding and hydrogen ion implant splitting to transfer the electro-optical layer. The handle substrate may include CMOS or GaAs circuitry. The resulting handle substrate with transferred electro-optical layer may be utilized to form various optical devices.

According to one aspect of the present invention, a method is provided for manufacturing an electro-optical device comprising the steps of providing a transfer substrate including a growth substrate and an electro-optical layer and implanting hydrogen ions or hydrogen ions in combination with other ions such as helium or boron into the transfer substrate to form an intermediate hydrogen ion implant layer thereby defining an electro-optical layer portion of the transfer substrate which includes at least a portion of the electro-optical layer. A handle substrate is then provided and bonded to the transfer substrate along a bonding surface to form a joined structure. The joined structure is heated to a temperature sufficient to split the joined structure along the hydrogen ion implant layer thereby to transfer the electro-optical layer portion of the transfer substrate to the handle substrate and to form a splitting surface on the electro-optical layer portion. In alternate embodiments, the handle substrate comprises CMOS or GaAs circuitry. In further alternative embodiments, the hydrogen ion implant layer forms within the electro-optical layer or within the growth substrate layer.

According to another aspect of the present invention, a method is provided for manufacturing an electro-optical device comprising the steps of providing a growth substrate layer having an electro-optical layer and implanting hydrogen ions in the electro-optical layer to form an intermediate hydrogen ion implant layer thereby defining an electro-optical layer portion of the electro-optical layer. A first index-of-refraction material is deposited on the electro-optical layer. A first metal electrode is formed on the first low index-of-refraction material. A dielectric layer is deposited and planarized to form a planarized dielectric surface over the first metal electrode. The planarized dielectric surface is bonded to a handle substrate to form a joined structure. The joined structure is heated to a temperature sufficient to split the hydrogen ion implant layer thereby to transfer the electro-optical layer portion.

According to yet another aspect of the present invention, a method is provided for manufacturing an electro-optical device comprising the steps of providing a transfer substrate having a growth substrate layer. Hydrogen ions are implanted in the growth substrate to form an intermediate hydrogen ion implant layer thereby defining a growth layer portion of the transfer substrate which includes at least a portion of the growth substrate layer. A handle substrate is provided having a planarized surface of either a GaAs circuit or a CMOS circuit. The growth substrate layer is bonded to the planarized surface to form a joined structure. The joined structure is heated to a temperature sufficient to split the joined structure along the hydrogen ion implant layer thereby to transfer the growth layer portion of the transfer substrate to the handle substrate and to form a splitting surface on the growth layer portion. A thin film electro-optical layer is grown on the splitting surface.

According to another aspect of the present invention, an electro-optical device is provided which includes a substrate having either CMOS or GaAs circuitry formed therein. An electro-optical layer is formed over the substrate.

A feature of the present invention relates to growing an electro-optical layer on an optimized growth substrate, which is different from an optimized handle substrate and may contain GaAs or CMOS circuitry.

An advantage of the present invention relates to growing electro-optical layers with enhanced electro-optical properties resulting from growing the electro-optical layers on an optimized growth substrate and under optimal electro-optical layer growth conditions.

An additional feature of the present invention relates to locating an electro-optical layer directly over GaAs or CMOS circuitry with the GaAs or CMOS circuitry controlling the optical properties of the electro-optical layer. For example, the present invention may be employed in a cross-point optical routing array, which has optical switches in the form of electro-optical layers formed directly over GaAs or CMOS circuitry with the GaAs or CMOS circuitry controlling the switching. As a result, the GaAs or CMOS circuitry can provide cross-point switch for optical routing of fiber-optic signals.

Further features and advantages of the present invention will be set forth in, or apparent from, the detailed description of preferred embodiments thereof which follows.

DETAILED DESCRIPTION OF THE INVENTION

Figure 1A:
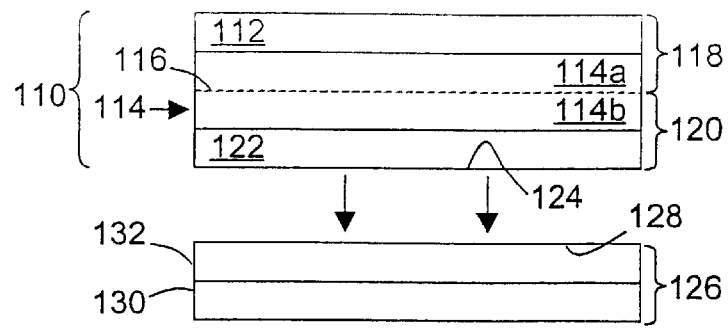
FIGS. 1(a)–1(d) are schematic sectional views of a manufacturing method for forming an electro-optical device according to the present invention.
Figure 1B:
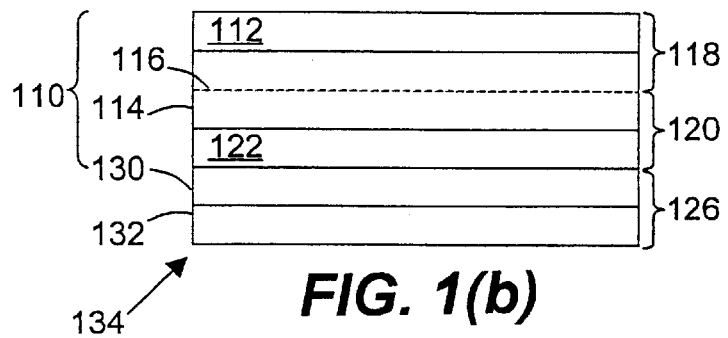
Figure 1C:
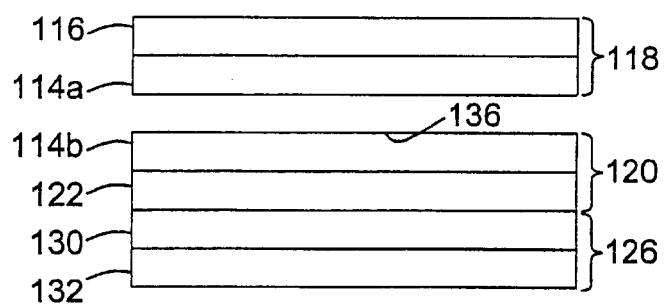

Referring generally to FIGS. 1(a)–1(c), depicted therein is a manufacturing process of an electro-optical device. Turning now specifically to FIG. 1(a), transfer substrate 110 includes growth substrate 112 upon which electro-optical layer 114 is grown. Advantageously, growth substrate 112 is composed of a material adapted for optimal growth of a desired electro-optical layer. For example, growth substrate 112 may be formed of material such as GaAs, InP, $SrTiO_3$, MgO or any other substrate material known in the art to promote electro-optical layer growth.

The electro-optical layer 114 is grown under typical electro-optical layer growth conditions known in the art. Optimally, the growth conditions, including an annealing temperature, are optimized to promote growth of a preferable electro-optical layer. The electro-optical layer 114 may be formed of numerous electro-optical materials, which are selected based upon an intended use and application of the electro-optical device. The electro-optical material may include a single-crystal electro-optical material such as $LiNbO_3$, $BaTiO_3$, $TeO_2$, $BaSrNbO_3$, PZT, GaAs, PLZT, and a PMT relaxor single-crystal material. Further, the electro-optical layer 114 may be comprised of a high temperature sintered ceramic or thin film polycrystalline electro-optical material.

A hydrogen ion implantation process produces an intermediate hydrogen ion implant layer 116 in the electro-optical layer 114 and thereby define electro-optical layer portions 114a and 114b. Further, the hydrogen ion implant layer 116 divides the transfer substrate 110 into two portions, a substrate portion 118 and an electro-optical portion 120, which includes the electro-optical layer 114b.

During hydrogen implantation, it may be necessary to cool the growth substrate 112 so as to prevent the crystalline material of the growth substrate 112 from becoming too hot as to potentially damage the electro-optical material 114. Further, it may be desirable to co-implant ions such as helium or boron to lower the hydrogen implant layer splitting temperature or to lower the required hydrogen ion implant dose. Optimally, the hydrogen ion implant layer 116 is at a depth of approximately 500 nm into the electro-optical layer 114. Typically, a dose of greater than $1\times10^{16}cm^{-3}$ with energy of approximately 65 KeV is necessary to produce hydrogen ion implant layer 116 at the 500 nm depth when the electro-optical layer 114 is composed of a single crystal material.

Optionally, a lower index-of-refraction material 122 is deposited over the electro-optical layer 114. The lower index-of-refraction material 122 may include silicon oxide applied to the electro-optical layer 114 either before or after hydrogen ion implantation. Alternatively, the low index-of-refraction material 122 can be a sputter or evaporated glass layer to be used for anodic bonding of the transfer substrate 110 to an appropriate handle substrate 126. Alternatively, the lower index-of-refraction material 122 can be a high temperature polymer adhesive.

The handle substrate 126 may be composed of materials such as glass, sapphire, GaAs, quartz, Kapton, or silicon. The desired handle substrate material is selected based on the characteristics of the material, which are desirable for various electro-optical device applications. For example, it is desirable to have a highly insulating handle substrate with a low lost tangent to be used in an electro-optical device such as a microwave traveling wave optical modulator.

Optionally, the handle substrate 126 may comprise a base layer 130 upon which a glass layer 132 is sputter deposited. For example, it may be desirable to have the glass layer 132 when anodically bonding to an insulating handle substrate such as sapphire or quartz.

A top surface 124 of transfer substrate 110 and the bonding surface 128 are cleaned prior to bonding the transfer substrate 110 to the handle substrate 126. The cleaning process removes particulates and hydrocarbons and may include the use of snow jet cleaning, RCA1, piranha, and UV ozone to remove organics on the top bonding surfaces 124, 128. Optionally, it may be necessary to perform a chemical cleaning step to make the bonding surfaces 124, 128 hydrophilic. However, it may not be necessary to achieve a hydrophilic surface when the bonding technique is anodic bonding.

The transfer substrate 110 is bonded to the handle substrate 126 to form a joined structure 134 (FIG. 1(b)). One of numerous bonding methods may be used to bond the transfer substrate 110 to the handle substrate 126. Such bonding techniques include anodic bonding, direct bonding, glass frit bonding, vacuum bonding, pressure bonding, diffusion bonding, and polymer adhesive bonding.

The joined structure 134 is heated to cause hydrogen gas in the electro-optical layer 114 to expand, thereby splitting the electro-optical layer 116 along the hydrogen ion implant layer 116 which corresponds to the location of the peak of the hydrogen implant thereby forming a splitting surface 136 (FIG. 1(c)). The temperature necessary to split the electro-optical layer is usually on the order of 200° C. to 500° C.

An optional low temperature annealing process of approximately 200° C. may be used to increase the bond strength between the transfer substrate 110 and the handle substrate 126 prior to the hydrogen layer splitting.

An optional annealing step in an oxygen ambient environment can be performed on the electro-optical layer 114b transferred to the optimal handle substrate 126 to anneal out any possible proton implant damage.

In another optional step, the splitting surface 136 may be polished. The hydrogen layer splitting process may have left the splitting surface 136 with a surface roughness of approximately 8 nm. Therefore, it may be desirable to perform a touch polish on the splitting surface 136 prior to further processing of the electro-optical device.

Subsequently, the electro-optical material 114b may be formed into a waveguide. For example, ridgewave guides can be made by photolithographically defining and etching the electro-optical material 114b via ion milling or reactive ion etching (RIE).

Figure 1D:
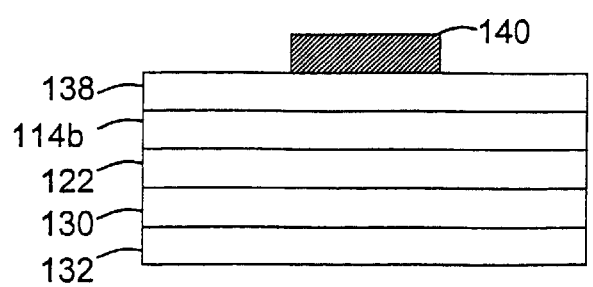

Alternatively, a waveguide can be formed by depositing a dielectric layer 138 over the electro-optical material 114b and then photolighographically defining regions where the dielectric layer 138 is to be removed (FIG. 1(d)). The dielectric layer 138 is composed of a low index-of-refraction material and acts as an optical buffer. Next, metal electrode 140 is deposited and defined on the dielectric layer 138.

The metal electrode 140 can be arranged in a co-planar transmission line configuration providing for high frequency operation. Further, the metal electrode 140 can also be defined to be above or below the electro-optical material 14b to achieve higher electric fields and thus produce low driving voltages during the operation of the optical modulator and optical switches for use as a ridge waveguide. It is desirable to have the handle substrate 126 be composed of a highly insulating material such as quartz, semi-insulating GaAs, glass, polymer, sapphire or other suitable materials to be able to implant high frequency, low loss transmission lines.

Alternatively, planar electrodes (not shown) can be photolithographically defined adjacent to the electro-optical layer 114b to implement an electro-optical modulator or optical switch. However, it is preferable to have an optical buffer material supporting the waveguide core material (i.e., the ridgewave guide formed from the electro-optical layer 114b) and the metal electrode 140.

Turning now to FIGS. 2(a)–2(d), the electro-optical layer portion transferred from a transfer substrate 210 to the optimized handle substrate 226 includes a portion of a growth substrate 212 upon which the electro-optical layer 214 is formed. The embodiment depicted in FIGS. 2(a)–2(d) provide for an electro-optical device such as a planar waveguide and an electro-optical modulator with switches.

In this and the remaining embodiments described herein, like elements of the embodiment depicted in FIGS. 1(a)–1(d) have been given like reference numbers throughout this disclosure and are only described where the corresponding elements differ from the previous embodiments described.

Figure 2A:
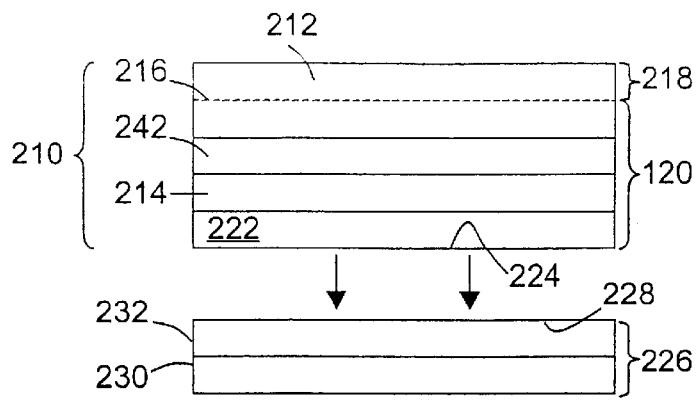
FIGS. 2(a)–2(d) are schematic sectional views of an alternative manufacturing method for forming an electro-optical device of the present invention.

Referring now specifically to FIG. 2(a), growth substrate 212 may comprise GaAs or InP and the electro-optical layer 214 may comprise InGaAsP, GaAs/AlGaAs multiquantum wells, InAsP/InGaP multiple quantum wells, and InGaAlSAs/InAlAs multiple quantum wells. An optional etch stop layer 242 composed of AlGaAs is formed on the growth substrate 212.

During the hydrogen oxygen ion implant step, the intermnediate hydrogen ion implant layer 216 is formed in the growth substrate 212 thereby defining a substrate portion 218 and an electro-optical layer portion 220. The hydrogen ion implant layer 216 penetrates the growth substrate layer 212 approximately 200 nm deep.

Figure 2B:
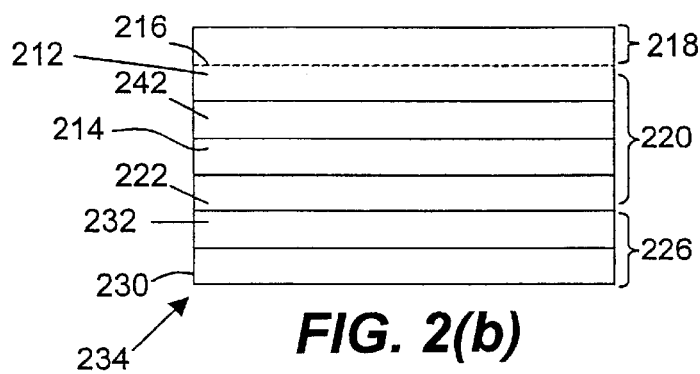
Figure 2C:
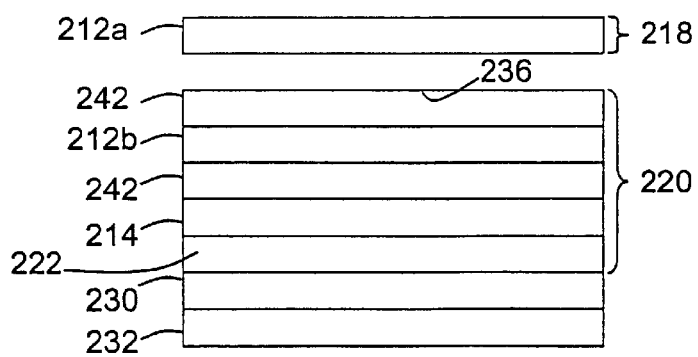
Figure 2D:
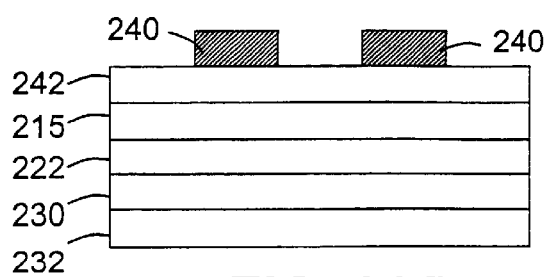

The transfer substrate 210 is bonded to the handle substrate 226 to form a joined structure 234 (FIG. 2(b)). The joined structure 234 is heated to cause hydrogen gas in the growth substrate 212 to expand and to thereby split the growth substrate 212 along the hydrogen ion implant layer 216 (FIG. 2(c)). Subsequent to the splitting step, the growth substrate portion 212b is etched back to stop at the etch stop layer 242. Substrate portion 218 comprising growth substrate portion 212a is thereby departed from the electro-optical layer portion 220.

Further processing of the electro-optical device formed on the handle substrate 232 may include forming a ridge waveguide 215 from the electro-optical layer 214 and metal electrodes 240 as described with reference to the embodiment depicted in FIG. 1(d).

In further additional processing steps to the embodiments depicted in FIGS. 1(a)–1(d) and 2(a)–2(d), the electro-optical material 114, 214 is used to form a waveguide laser or an optical amplifier. In such further processing steps, the electro-optical layer 114, 214 is doped with a rare earth ion either during the growth of the electro-optical layer 114, 214 or by performing a rare earth doping diffusion process on the electro-optical layer 114, 214 after growth. The electro-optical material may be rare-earth (e.g., erbium) doped crystals of LiNbO$_3$. The resulting electro-optical layer 114, 214 can then be incorporated into a waveguide laser or an optical amplifier.

In a specific embodiment of the ones depicted in FIGS. 1(a)–1(d) and 2(a)–2(d), the electro-optical material is obtained from high temperature sintered ceramic material or a thin film growth of polycrystalline material. The sintered ceramic material typically is formed at around 1300° C. to 1600° C. Methods for forming the thin film polycrystalline material includes laser deposition, epitaxial growth, and sol-gel growth on the growth substrate 112, 212 composed of such material as SrTiO$_3$, MgO or silicon. Examples of thin film polycrystalline material include ferroelectric material and PLZT material.

It may be desirable to use sintered ceramic material or polycrystalline material as the electro-optical material when, for example, the best quality material is in a high temperature sintered ceramic or thin-film polycrystalline form. Further, a larger electro-optical layer may be obtained using high temperature sintered ceramic or thin film growth methods.

As described above with reference to the methods depicted in FIGS. 1(a)–1(d) and FIGS. 2(a)–(d), the electro-optical material may be integrated with GaAs or CMOS circuitry. The handle substrates 126, 226 preferable for the microwave circuitry include semi-insulating GaAs, InP, InGaAs, glass, quartz, and sapphire. If the electro-optical material 114, 214 is transferred to the handle substrate 126, 226 prior to circuit fabrication, then the electro-optical material 114, 214 must be able to withstand the subsequent processing temperatures of the circuitry without degradation. Typical processing temperatures for GaAs circuitry might include an annealing temperature of 500° C. for annealing a doping implant. Alternatively, a processing temperature of less than 400° C. may be employed when all of the doping regions of the electro-optical layer 114, 214 are formed by epitaxy prior to transferring the electro-optical layer 114, 214 to the handle substrate 126, 226.

Figure 3A:
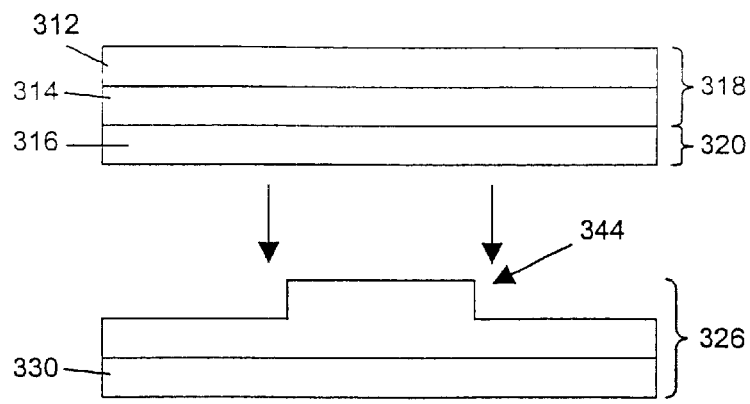
FIGS. 3(a)–3(b) are a schematic sectional view illustrating manufacturing steps in an alternative embodiment of the present invention.

Turning now to FIG. 3(a), when an electro-optical material 314 is transferred onto a microwave circuitry 330 after the completion of fabrication of the microwave circuitry 330 of handle substrate 326, a pedestal region 344 is formed which is higher than the top of the circuitry 330 to which the electro-optical layer 314 is to be bonded (FIG. 3(a)).

Figure 3B:
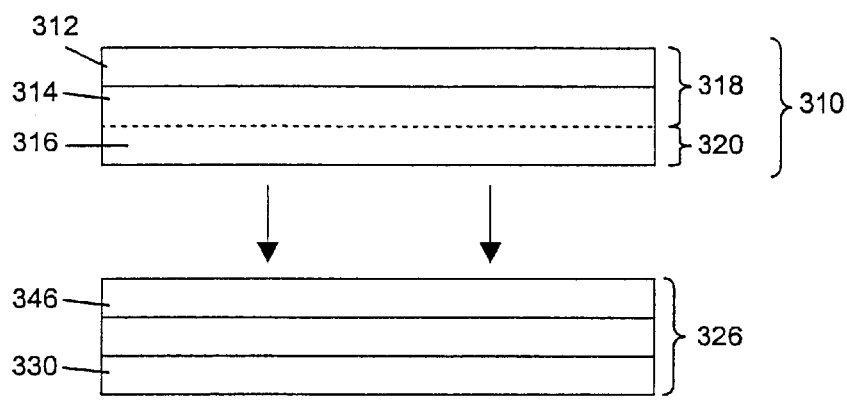

Alternatively, a dielectric layer 346 is formed over the microwave circuitry 330 of the handle substrate 326 (FIG. 3(b)). The dielectric layer 346 is then planarized by any conventional planarization method.

Figure 4:
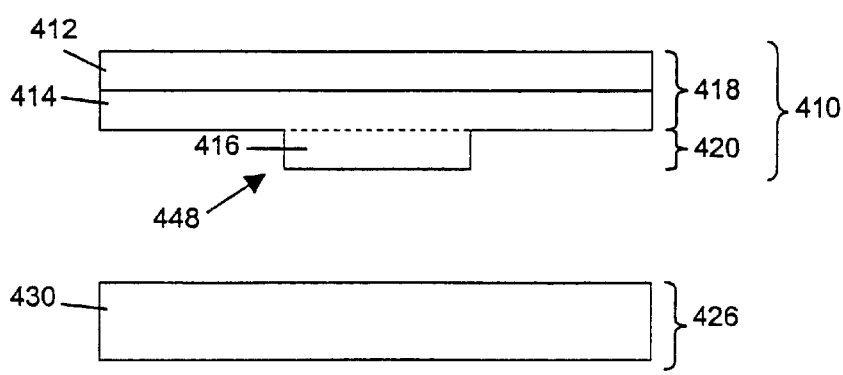
FIG. 4 is a schematic sectional view illustrating a further alternative manufacturing step according to an additional alternative embodiment.

Alternatively, a planeaus 448 (e.g., a mesa) is formed in the electro-optical substrate 414 (FIG. 4) and the planeaus 448 is aligned to a desired region on a microwave circuit 430 of a handle substrate 426.

Figure 5A:
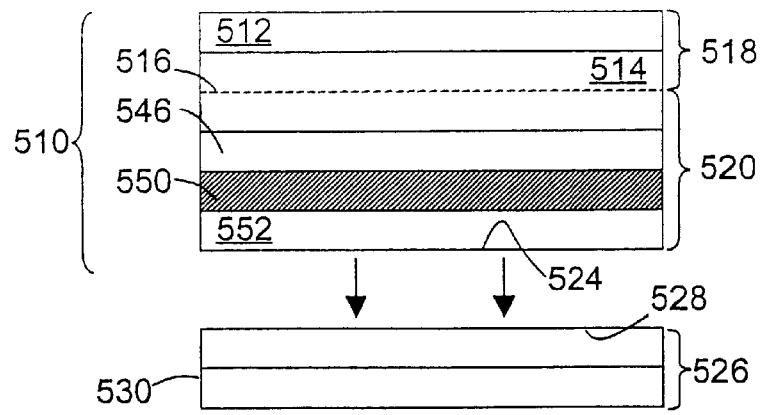
FIGS. 5(a)–5(c) are schematic sectional views illustrating various steps of an additional alternative embodiment of the present invention.
Figure 5B:
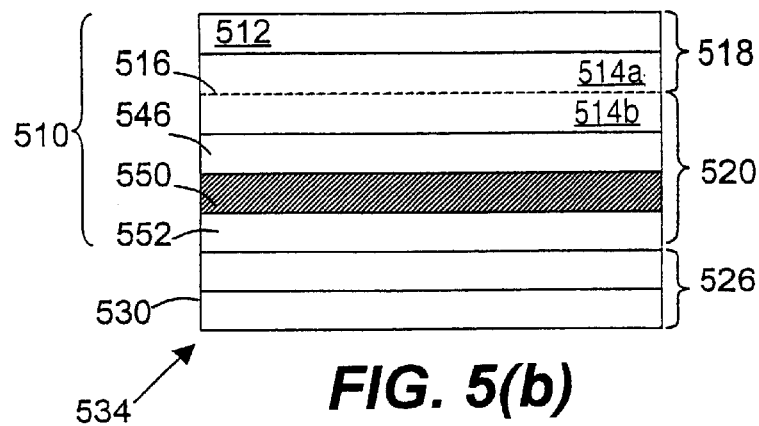
Figure 5C:
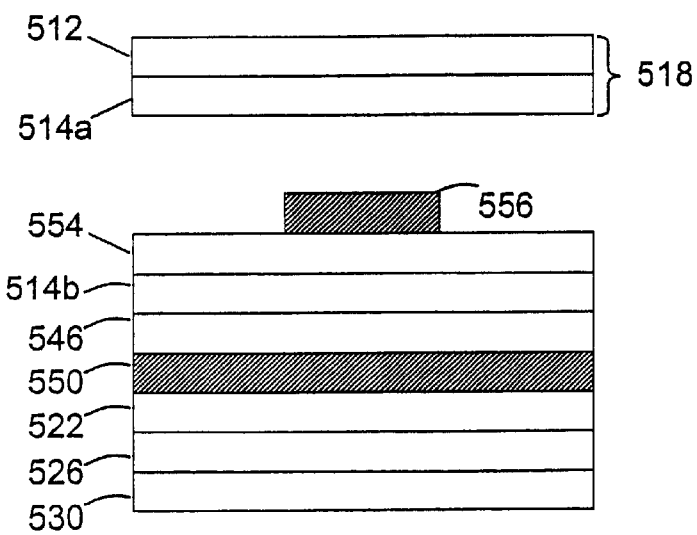

Turning now to FIGS. 5(a)–5(c), bottom and topside metal electrodes 550, 556 may be formed on an electro-optical layer 514 during the fabrication of an electro-optical modulator and optical switches.

Referring now specifically to FIG. 5(a), a bottom metal electrode 550 is deposited and photolithographically defined on the low index-of-refraction material 546. A thick dielectric layer 552 is formed over the bottom metal layer 550 and planarized using CMP to form a bonding surface 524.

The transfer substrate 510 is bonded to a bonding surface 528 of a handle substrate 526 to form a joined structure 534 (FIG. 5(b)). The bonding may include anodic bonding, polymer adhesive bonding, and ceramic adhesive bonding.

The joined structure 534 is heated to cause the hydrogen to expand and split off a substrate portion 518 which includes growth substrate 512 and an electro-optical layer portion 514a from an electro-optical layer portion 520 which includes a thin electro-optical layer portion 514b and the bottom metal layer 550 bonded to the handle substrate 526 (FIG. 5(c)).

A thin layer of low index-of-refraction material 554 is then deposited on the electro-optical layer 514b. A metal layer is formed on the low index-of-refraction layer 554 and photolithographically defined to form a top metal electrode 556.

Alternatively, rather than forming the thin layer of low index-of-refraction material 554, the top electrode 556 may be formed vertically on the electro-optical material 514b. However, it is preferable, in terms of optical losses during operation of an electro-optical device to have the index-of-refraction material 554 formed between the electro-optical layer 514 and the top electrode 556.

In an alternative process to the one depicted and described above with reference to FIGS. 5(a)–5(c), the bottom side metal electrode, metal electrode 550, may be formed directly on the handle substrate 526. The metal electrode surface can then be anodically bonded to the low index-of-refraction material 546 or the planarized dielectric layer 552.

As described above with reference to the embodiments of FIGS. 1–4, the optimized substrate 526 may include a CMOS, GaAs, or bipolar circuit that is fabricated on a silicon or GaAs substrate 530.

One possible approach to form a silicon CMOS or bipolar circuit is to fabricate the surface first, then planarize a top oxide level of the circuit, and then bond the planarized surface to the metal electrode 550. Preferably, the splitting temperature should be lower than approximately 500° C. so as not to damage the CMOS or bipolar circuits.

In an optional alternative embodiment for a high frequency electro-optical modulator, two metal layers (not shown) can be formed on the low index-of-refraction material 554 to form a strip-line transmission line.

Figure 6A:
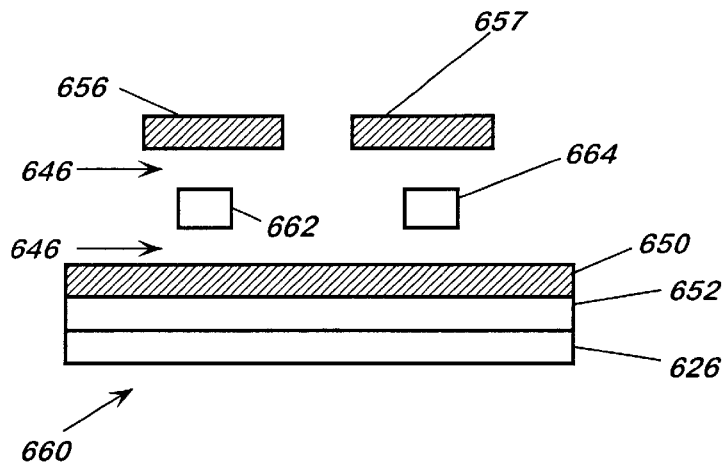
FIG. 6(a) is a partial schematic sectional side view of a waveguide strip-line traveling wave optical modulator/switch taken through section 6(a)–6(a) of FIG. 6(b) with vertical metal electrode according to the present invention.
Figure 6B:
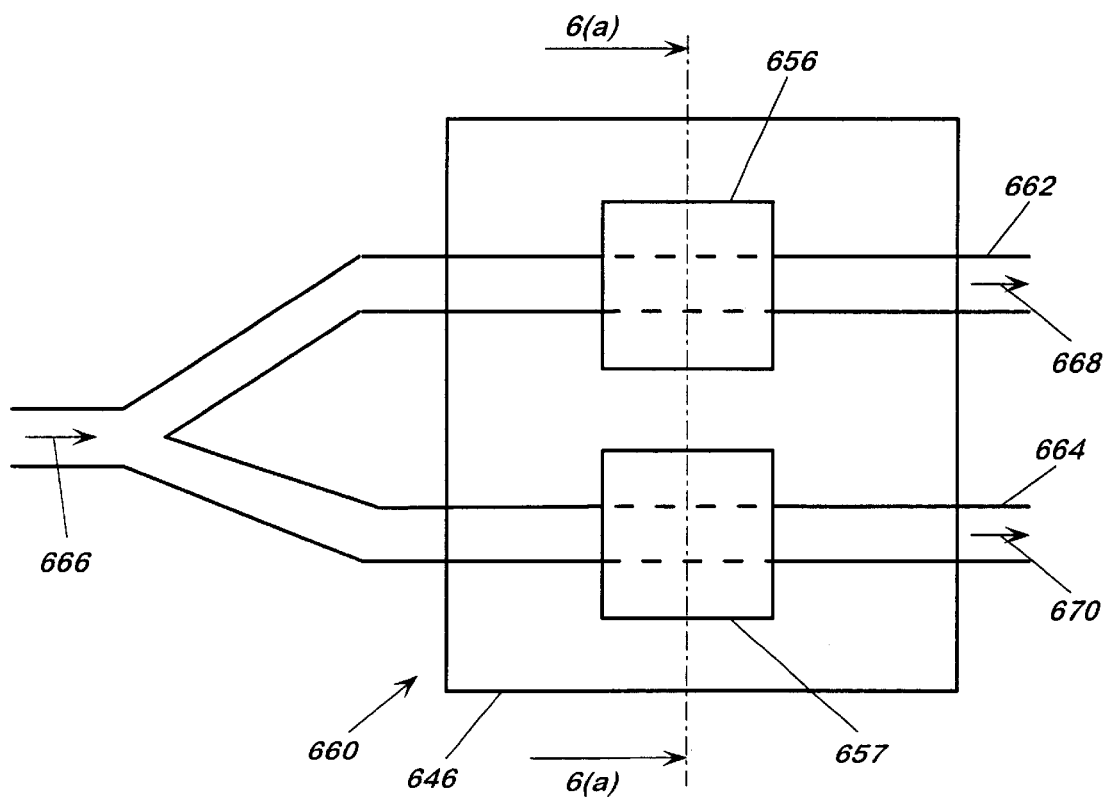
FIG. 6(b) is a top view of the optical modulator/switch of FIG. 6(a) with extended waveguides.

Turning now to FIGS. 6(a) and 6(b), a vertical electrode waveguide optical switch 660 represent further processing steps to the embodiment depicted in FIGS. 5(a)–5(c). As depicted, the optical switch 660 includes two electro-optical waveguides 662, 664 formed from the electro-optical material transferred to handle substrate 626. The waveguides 662, 664 are surrounded by low index-of-refraction dielectric material 646. The bottom metal electrode forms a GND electrode 650. Two top metal capacitor electrodes 656, 657 are formed on the dielectric layer 646.

During the operation of optical switch 660, a voltage V+ and V− is applied to the metal electrodes 650, 656, 657 to create a phase shift in the electro-optical material 662, 664. By varying the voltages applied to the electrodes 650, 656, 657, an input light signal 666 can be selectively directed to an output light signal 668, 670 as desired to provide the appropriate optical switching.

Figure 7A:
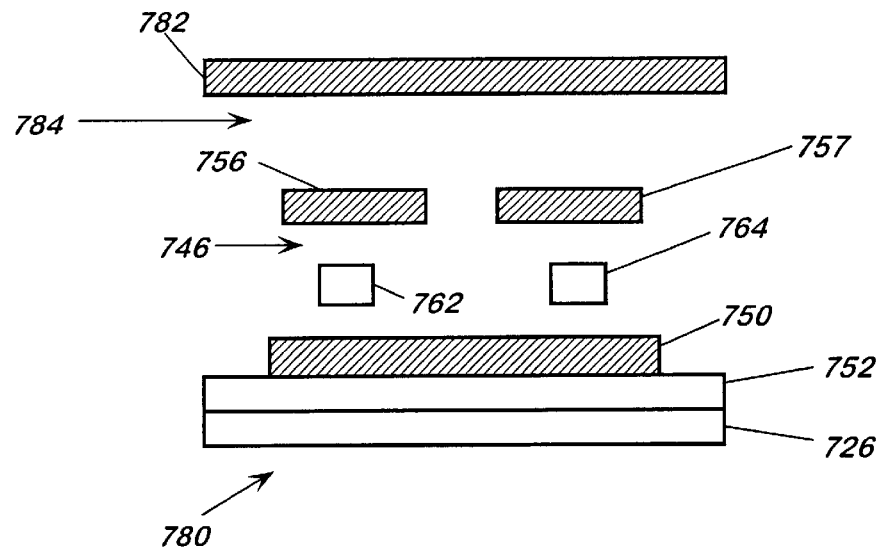
FIG. 7(a) is a partial schematic sectional side view of a microstrip traveling wave vertical electrode waveguide optical switch taken through section 7(a)–7(a) of FIG. 7(b) in accordance with the present invention.
Figure 7B:
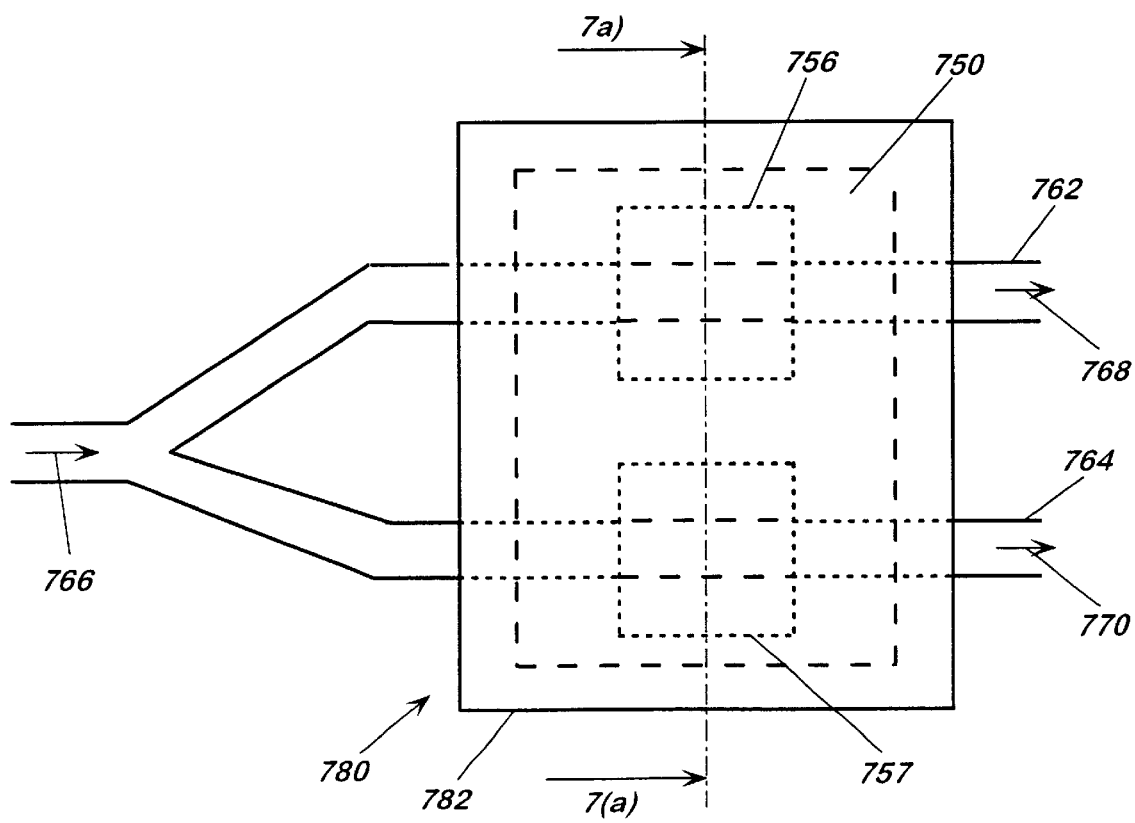
FIG. 7(b) is a top view of the optical switch of FIG. 7(a) with extended waveguides.

Further alternative processing steps to the embodiment depicted in FIGS. 5(a)–5(c) results in a microstrip traveling wave vertical electrode waveguide optical switch 780 depicted in FIGS. 7(a) and 7(b). The optical switch 780 employs a vertical electrode configuration in which a third electrode, GND electrode 782, is formed over a dielectric layer 784 disposed on top of signal electrodes 756 and 757. During operation, the optical switch 780 provides a lower driving voltage than that of a planar electrode since the vertical electrode configuration can produce higher electric fields than a planar electrode configuration.

Figure 8:
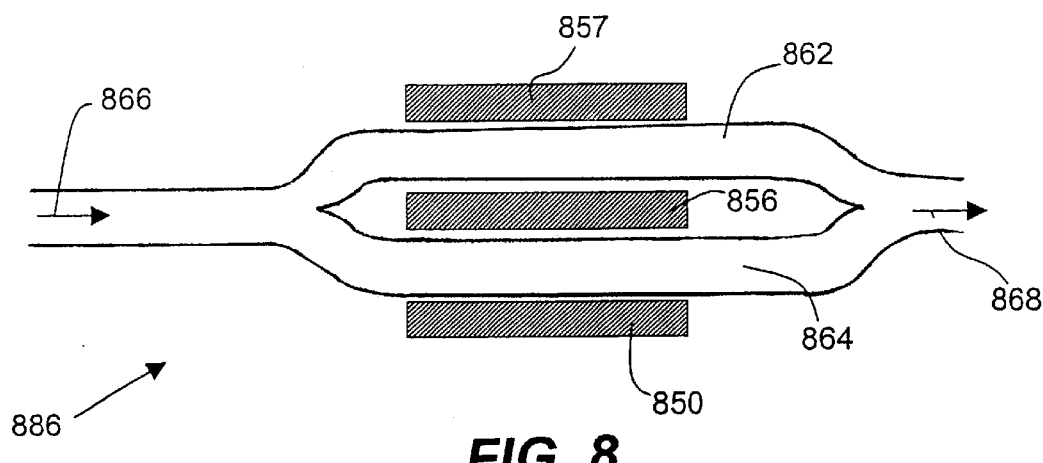
FIG. 8 is a top side view of a planar waveguide electro-optic Mach-Zehnder interferometer modulator according to the present invention.

Referring now to FIG. 8, a planar waveguide electro-optic Mach-Zehnder modulator 886 may be formed by further processing of the embodiments depicted in FIGS. 1–5. The planar modulator 886 includes electro-optical layers 862, 864 transferred to handle substrate using hydrogen ion implantation splitting using any of the methods previously described.

A GND center metal electrode 856, a −V metal electrode 857 and a +V metal electrode 850 are used to apply selective voltages to create a phase shift in the electro-optical layers 862, 864. Specifically, a voltage is applied to push-pull +V and −V metal electrodes 850, 857 to create the phase shift in the light path to affect an input light signal 866 to form an output light signal 868.

Figure 9:
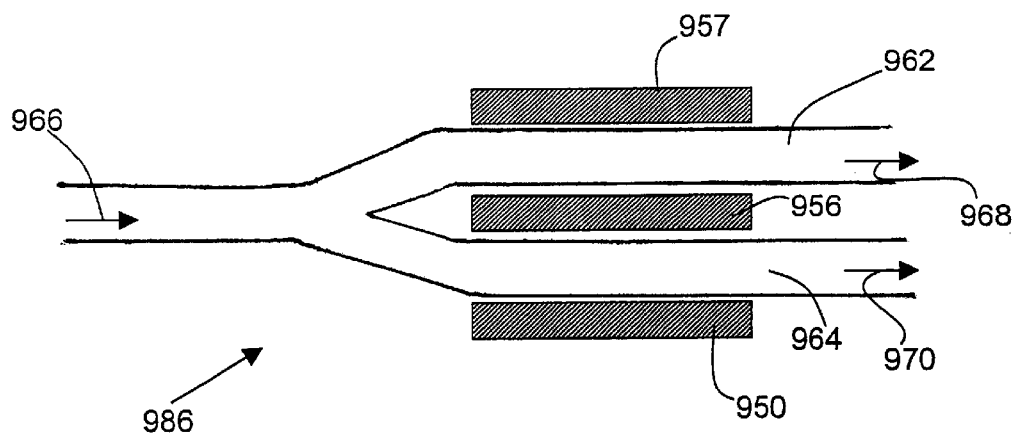
FIG. 9 is a top side view of a planar waveguide digital electro-optic switch in accordance with the present invention.

Referring now to FIG. 9, using yet another set of further processing steps to the embodiments depicted in FIGS. 1–5, a planar electro-optical switch 986 includes three electrodes, 950, 956, and 957. Applying a voltage to center electrode 956 with respect to the two outside GND metal electrodes 950, 957, can switch an input light signal 966 from a first output signal 968 to a second output light signal 970.

Figure 10:
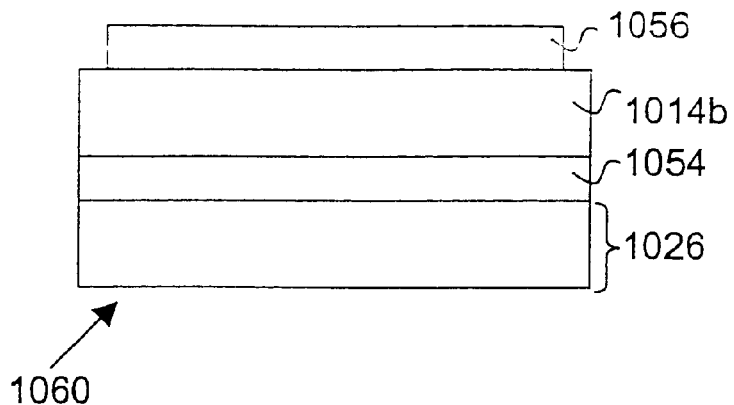
FIG. 10 is a schematic sectional view of an illuminated spatial light modulator in accordance with the present invention.

Referring now to FIG. 10, in another further specific alternative embodiment, a surface normal illuminated spatial light modulator 1060 can be formed by using hydrogen ion splitting to transfer an electro-optic layer of PLZT 1014b to a handle substrate 1026, which includes a CMOS or GaAs circuit. A low index-of-refraction dielectric material 1054, 1056 sandwiches the PLZT electro-optic layer 1014b therebetween. The low index-of-refraction layers 1054, 1056 are composed of transparent indium tin oxide (InSnO) material and form conductive electrodes.

The CMOS circuitry of substrate 1026 can be used to control the operation of each pixel (not shown) of a spatial light modulator 1060. The PLZT layer 1014b can be grown using a high temperature sinter ceramic process with a thin layer 1014b transferred to the CMOS circuitry of substrate 1026 using any of the hydrogen ion implant splitting approaches as described above with reference to FIGS. 1–5.

Figure 11A:
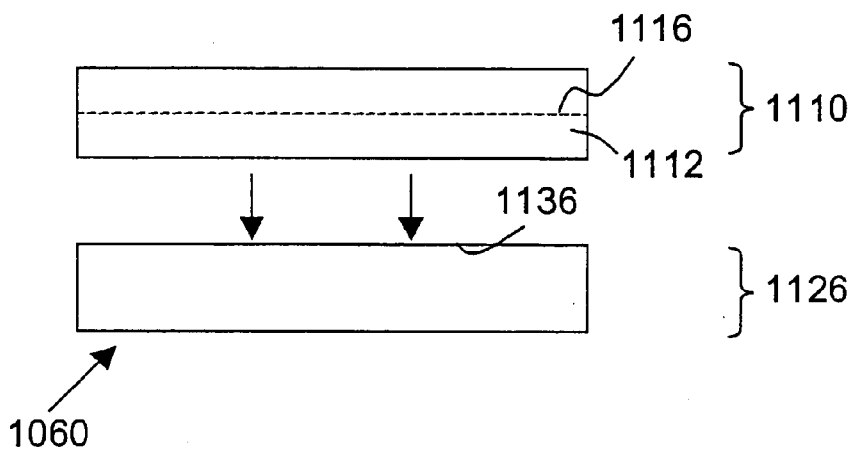
FIGS. 11(a) and 11(b) are schematic sectional views illustrating processing steps for manufacturing an electro-optical device wherein a growth substrate is first transferred to a handle substrate prior to growing an electro-optical layer thereon.

Turning now to FIGS. 11(a) and (b), in a further alternative embodiment, an electro-optical/photorefractive material 1114 is formed on a growth transfer substrate 1112 after the growth substrate 1112 has been bonded to handle substrate 1126. Referring now specifically to FIG. 11(a), the transfer substrate 1110 includes a growth substrate 1112 which promotes a thin-film growth of the electro-optical material 1114 such as ferroelectric material, piezoelectric material or superconductive material. For example, the growth substrate 1112 may include $SrTiO_3$ and MgO. Hydrogen ion implantation produces hydrogen ion implant layer 1116 within the growth substrate 1112.

Figure 11B:
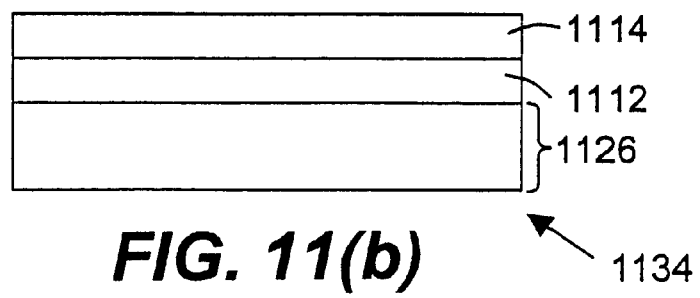

The transfer substrate 1110 is bonded to a CMP planarized surface 1136 of the handle substrate 1126 which comprises a CMOS or GaAs circuit thereby producing a joined structure 1134 (FIG. 11(b)). The joined structure 1134 is heated thereby transferring a portion of the growth substrate 1112 to the optimized handle substrate 1126.

Electro-optical/photorefractive layers 1114 are then grown on the growth substrate 1112 transferred to the handle substrate 1126. Alternatively, thin films of electro-optical material such as PZT, PLZT, and high temperature superconducting material can be grown on the growth substrate 1112 using a number of deposition techniques known in the art.

One limitation on the type of thin film growth that may be formed on the growth substrate 1112 transferred to the optimized handle substrate 1126 is that the growth (including annealing) temperature has to be compatible with the GaAs or CMOS circuit present in the handle substrate 1126. For example, the growth conditions for the electro-optical material 1114 are such that the growth temperature is compatible (i.e., not harmful) to the GaAs or CMOS circuit present in the handle substrate 1126.

Figure 12A:
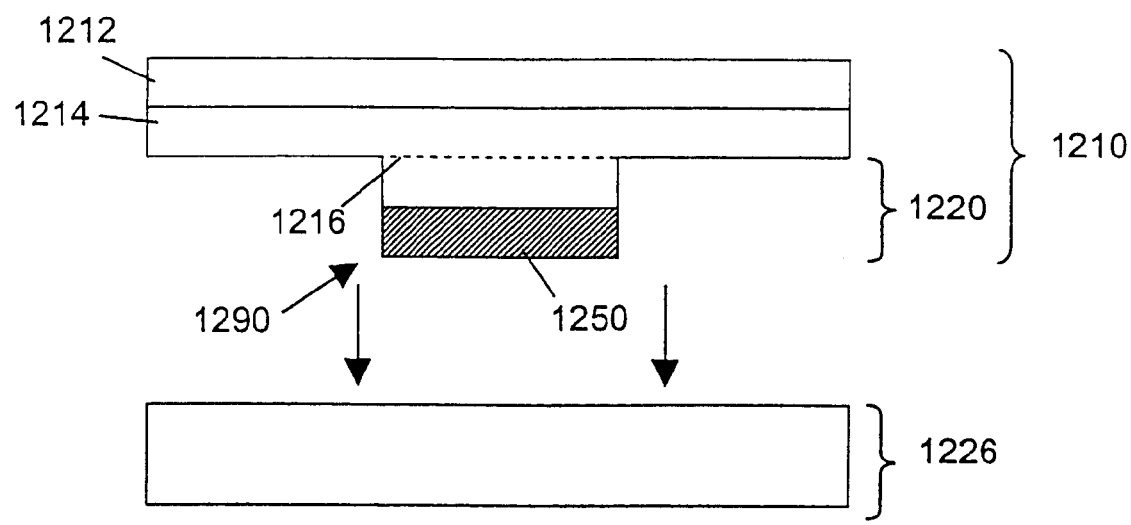
FIGS. 12(a) and 12(b) are schematic sectional views illustrating various processing steps in transferring a select portion of an electro-optical layer between a growth substrate and a handle substrate.
Figure 12B:
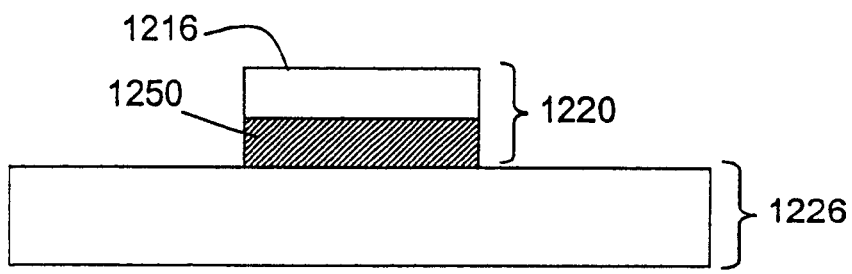

Turning now to FIGS. 12(a) and 12(b), a selected area or areas of an electro-optical material 1214 may be transferred to a handle substrate 1226. Referring now specifically to FIG. 12(a), a mesa 1290 is formed in the electro-optical material 1214 of the transfer substrate 1210 after forming an intermediate hydrogen ion implant layer 1216. The mesa 1290 may be formed by ion milling or RIE etching. Optionally, a metal electrode 1250 may be deposited on the mesa 1290.

The transfer substrate 1210 is bonded to the handle substrate 1226, which is then heated to split-away, and transfer an electro-optical layer portion 1220 to the handle substrate 1226 (FIG. 12(b)).

Figure 13A:
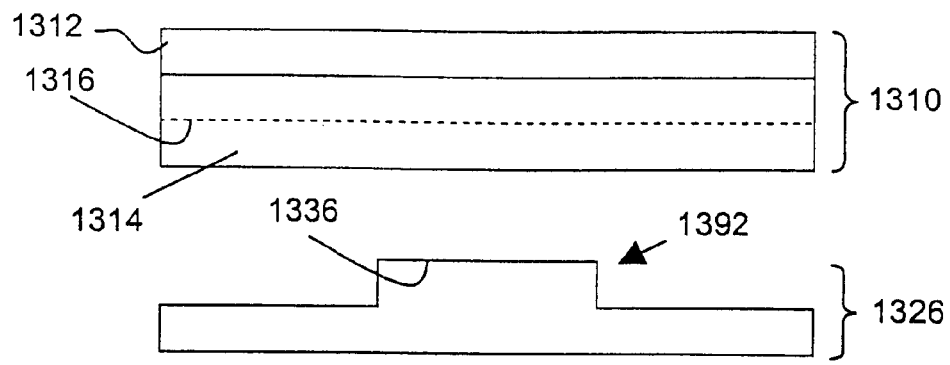
FIGS. 13(a)–13(c) are schematic sectional views illustrating the steps in an alternative method of transferring a portion of an electro-optic layer between substrates in accordance with the present invention.
Figure 13B:
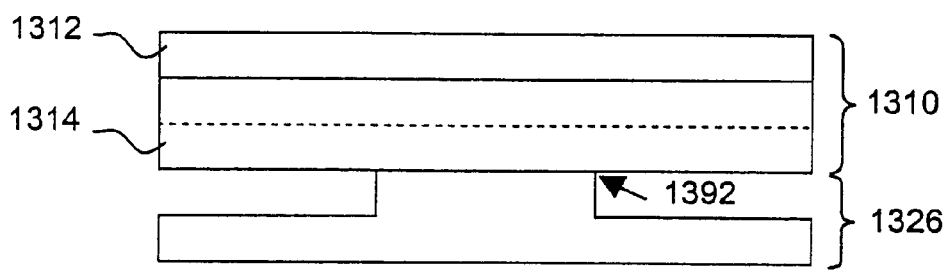
Figure 13C:
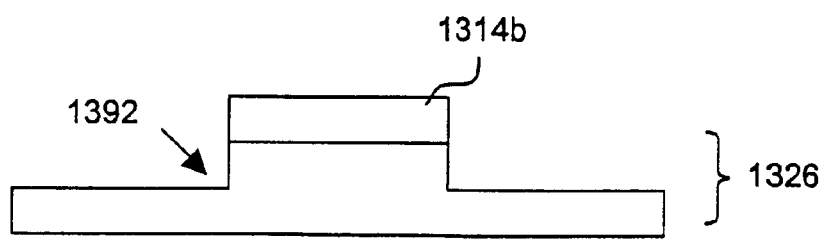

Turning now to FIGS. 13(a)–13(c), in an alternative embodiment to the one depicted in FIGS. 12(a) and 12(b), selective areas of the electro-optical material may be transferred to a handle substrate 1326 by first forming pedestals 1392 on a surface of the handle substrate 1326. The transfer substrate 1310 is bonded to the handle substrate 1326 only along a bonding surface 1336 of the pedestal 1392 to form a joined structure 1334 (FIG. 13(b)). After heating the joined structure 1334, only the electrical-optical layer portion 1314b, which was bonded to the bonding surface 1336, will be transferred to the handle substrate 1326 (FIG. 13(c)).

Figure 14A:
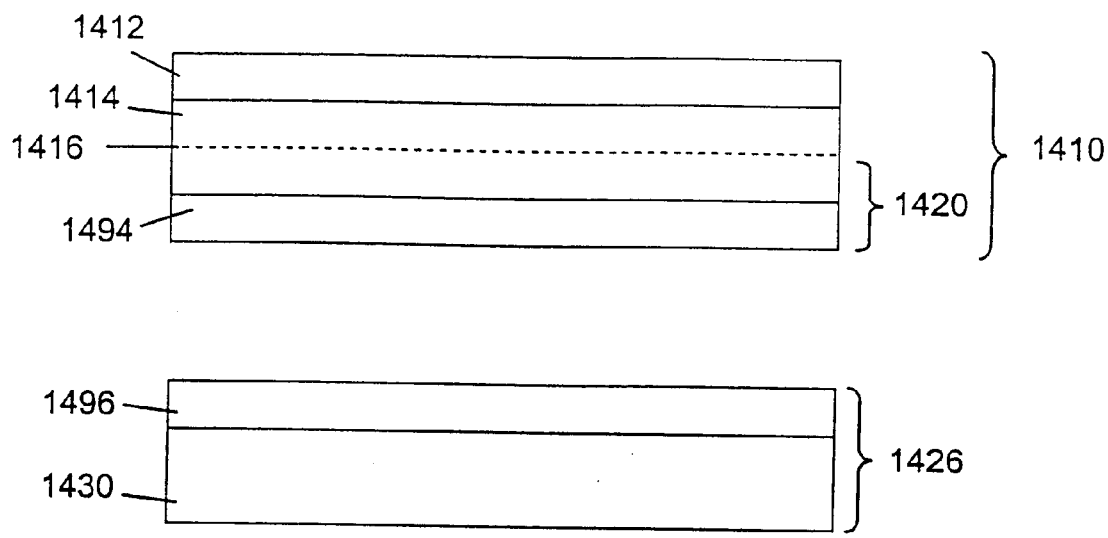
FIGS. 14(a) and 14(b) are schematic sectional views illustrating various manufacturing steps in forming an electro-optic layer on a Bragg cell in accordance with the present invention.
Figure 14B:
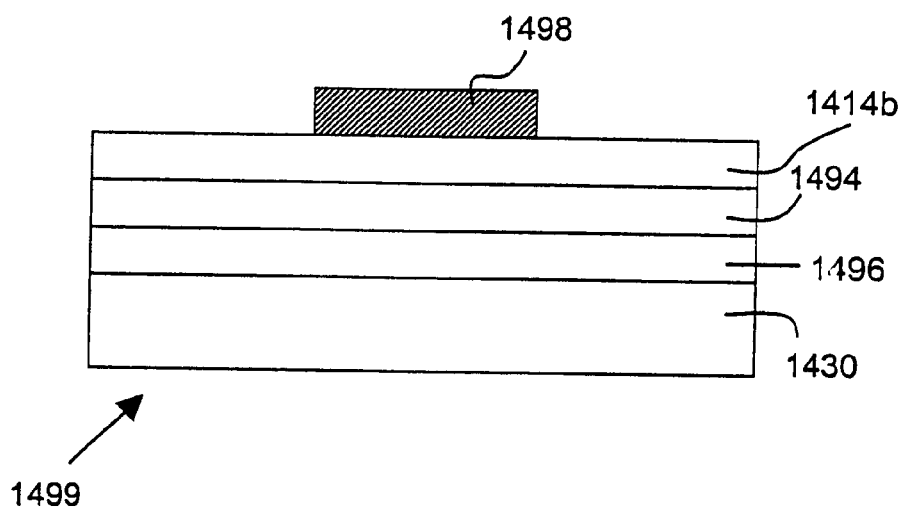

Turning now to FIGS. 14(a)–14(b) in yet another further specific alternative embodiment, an electro-optical layer 1414 composed of a single-crystal $LiNbO_3$ is transferred to a handle substrate 1426 comprising a Bragg cell crystal or sapphire lens using hydrogen implant splitting. Referring now specifically to FIG. 14(a), hydrogen ion implanting produces an intermediate hydrogen ion implant layer 1416 in the electro-optical layer 1414 formed on a growth substrate 1412. A thin metal layer such as indium 1494 is deposited on the electro-optical layer 1414 thereby completing the transfer substrate 1410.

An optimized handle substrates includes a base substrate 1430 such as a Bragg cell crystal or a sapphire lens with a thin metal layer such as indium 1496 formed thereon.

The transfer substrate 1410 is bonded to the optimized handle substrate 1426 using a number of bonding techniques which includes the use of pressure, temperature, vacuum and anodic bonding. Subsequently, heat is applied thereby transferring an electro-optical layer portion 1420 to the optimized handle substrate 1426 (FIG. 14(b)). A metal electrode 1498 is deposited on the electro-optical layer 1414b to implement a piezoelectric transducer for the Bragg cell 1499.

What is now apparent to one of ordinary skill in the art is that the present hydrogen ion splitting technique for transferring an electro-optical layer may be employed for numerous applications. For example, the present method now provides for the use of $BaTiO_3$ as an electro-optical material in electro-optical modulators and switches. $BaTiO_3$ has approximately a factor of 35 higher electro-optical effects than $LiNbO_3$. In addition, an electro-optical layer of $BaSrNb_3$ may be used in electro-optical modulators and switches, which has a factor of 13 higher electro-optical effects than $LiNbO_3$. As a result, the present method provides enhancements over prior electro-optical modulator and switches which incorporate $LiNbO_3$.

An additional advantage provided by the present method in the form of improved microwave transmission lines when transferring electro-optical layers forming semiconductor waveguiding layers to a highly insulating, low dielectric constant handle substrate. In addition, a reduced electrode parasitic capacitance is provided when these waveguiding layers are disposed-over a highly insulating, low dielectric constant handle substrate.

In addition, the present method provides for the transfer and use of electro-optical material including both single crystal and polycrystalline thin film material. Further, the present invention allows for making capacitors using thin film electro-optical materials grown on a separate optimized growth substrate such as $SrTiO_3$ or MgO using optimized thin film growth conditions and techniques which include pulsed laser deposition, sputter or other techniques at temperatures of around 600° C. to 900° C. Subsequently, these electro-optical materials grown under optimal growth conditions are then being transferred to a GaAs, silicon substrate, GaAs circuit, CMOS circuit or superconducting elements.

In addition, the present methods provide for making electro-optical modulators and optical switches with metal electrodes directly on the top and bottom surface of a ferroelectric dielectric layer rather than on capacitors that have planar interdigitated metal fingers on the top surface of the ferroelectric material.

Further, the present invention provides for transferring thin layers of a single crystal such as $SrTiO_3$, MgO, and $LaAlO_3$ to an optimized handle substrate. As a result, the present method provides the incorporation of a thin film of ferroelectric material or high temperature superconductive material in an electro-optical device formed on an optimized handle substrate. The optimized handle substrate may be highly insulating for microwave applications or the optimized handle substrate might be the surface of GaAs, a silicon substrate or the planarized surface of a GaAs, silicon or a superconductor substrate that contains circuits or superconductor elements.

Although the invention has been described above in relation to preferred embodiments thereof, it will be understood by those skilled in the art that variations and modifications can be effected in these preferred embodiments without departing from the scope and spirit of the invention.

What is claimed is:

1. A method of manufacturing an electro-optical device, said method comprising the steps of:

providing a transfer substrate comprising a growth substrate layer and an electro-optical layer which can transfer an optical signal;

implanting hydrogen ions or hydrogen ions in combination with other ions in the transfer substrate to form therein an intermediate hydrogen ion implant layer, defining an electro-optical layer portion of the transfer substrate which includes at least a portion of the electro-optical layer;

providing a handle substrate having a bonding surface;

bonding the transfer substrate to the bonding surface of the handle substrate to form a joined structure;

heating the joined structure to a temperature sufficient to split the joined structure along the hydrogen ion implant layer thereby to transfer the electro-optical layer portion of the transfer substrate to the handle substrate and to form a splitting surface on the electro-optical layer portion; and providing an electrode in association with said electro-optical layer or a portion thereof.

2. The method of claim 1, wherein said implanting hydrogen ion step forms the hydrogen ion implant layer within the electro-optical layer.

3. The method of claim 1, wherein said implanting hydrogen ion step forms the hydrogen ion implant layer within the growth substrate layer.

4. The method of claim 3, wherein the transfer substrate further comprises a stop etch layer grown on the growth substrate and upon which the electro-optical layer is disposed.

5. The method of claim 1, wherein said providing an handle substrate comprises:

depositing an insulating layer over one of prior fabricated CMOS circuitry and prior fabricated GaAs circuitry; and planarizing the insulating layer to thereby form the bonding surface.

6. The method of claim 1, wherein the bonding surface on the handle substrate comprises a low index-of-refraction material layer.

7. The method of claim 1, wherein the transfer substrate further comprises a low index-of-refraction material layer formed on the electro-optical layer.

8. The method of claim 7, wherein the handle substrate comprises a metal electrode forming the bonding surface.

9. The method of claim 1, wherein the growth substrate comprises one of GaAs and InP and the electro-optical layer comprises one of a InGaAsP layer, a GaAs/AlGaAs multi-quantum wells layer, a InAsP/InGaP multiple quantum wells layer, and a InGaAlAs/InAlAs multiple quantum wells layer grown on the growth substrate.

10. The method of claim 9, wherein the handle substrate comprises one of CMOS circuitry and GaAs circuitry.

11. The method of claim 1, further comprising patterning a design on the splitting surface and etching the electro-optical layer transferred to the handle substrate.

12. The method of claim 1, wherein the optimized handle substrate comprises an insulating layer having a low loss tangent.

13. The method of claim 1, wherein the electro-optical layer comprises an electro-optical material doped with a rare-earth ion.

14. The method of claim 1, wherein the electro-optical layer comprises one of a high temperature sintered ceramic material and a thin-film polycrystalline electro-optical material.

15. The method of claim 1, wherein the handle substrate comprises one of CMOS circuitry and GaAs circuitry.

16. The method of claim 1, further comprising the step of forming a mesa in the transfer substrate prior to said bonding step and said bonding step forms a bond between the mesa and the bonding surface of the handle substrate.

17. The method of claim 1, further comprising forming at least one pedestal in the handle substrate prior to said bonding step to thereby form the bonding surface.

18. The method of claim 1, wherein the handle substrate comprises a Bragg cell crystal, and said method further comprises:

depositing a first thin metal layer on the electro-optical layer prior to said bonding step; and said bonding step comprises forming a bond between the Bragg cell and the first thin metal layer; and forming a metal electrode on the splitting surface of the electro-optical layer portion.

19. The method of claim 18, wherein said Bragg cell comprises a second thin metal layer which forms the bonding surface.

20. The method of claim 1, wherein the electro-optical layer comprises a single-crystal electro-optical material selected from the group consisting of $LiNbO_3$, $BaTiO_3$, $TeO_2$, $BaSrNbO_3$, PLZT, GaAs and PMT relaxor.

21. The method of claim 20 wherein the handle substrate comprises one of CMOS and GaAs circuitry.

22. A method of manufacturing an electro-optical device, comprising the steps of:

providing a growth substrate having an electro-optical layer;

implanting hydrogen ions in the electro-optical layer to form a hydrogen ion implant layer defining an electro-optical layer portion of the electro-optical layer;

depositing a first low index-of-refraction material on the electro-optical layer;

forming a first metal electrode on the first low index-of-refraction material;

depositing and planarizing a dielectric layer to form a planarized dielectric surface over the first metal electrode;

bonding the planarized dielectric surface to an handle substrate to form a joined structure; and heating the joined structure to a temperature sufficient to split the joined structure along the hydrogen ion implant layer to thereby transfer the electro-optical layer portion to the handle substrate and to form a splitting surface on the electro-optical layer portion.

23. The method 22, further comprising depositing a second low index-of-refraction material on the splitting surface.

24. The method of claim 23, further comprising forming a second metal electrode on the second low index-of-refraction material.

25. The method of claim 22, further comprising forming a second metal electrode over the electro-optical optical layer portion transferred to the handle substrate.

26. A method of manufacturing an electro-optical device, said method comprising the steps of:

providing a transfer substrate including a growth substrate layer;

implanting hydrogen ions in the growth substrate layer to form therein an intermediate hydrogen ion implant layer defining a growth layer portion of the transfer substrate which includes a portion of the growth substrate layer;

providing a handle, substrate having a planarized surface including of one of a GaAs circuit and a CMOS circuit;

bonding the growth layer portion to the planarized surface to form a joined structure;

heating the joined structure to a temperature sufficient to split the joined structure along the hydrogen ion implant layer to thereby transfer the growth layer portion of the transfer substrate to the handle substrate and to form a splitting surface on the growth layer portion; and growing a thin film electro-optical layer on the splitting surface.

* * * * *